(12) United States Patent
Xu et al.

(10) Patent No.: US 11,993,860 B2
(45) Date of Patent: May 28, 2024

(54) LIGAND EXCHANGE OF NANOCRYSTAL FILMS

(71) Applicant: Lawrence Livermore National Security, LLC, Livermore, CA (US)

(72) Inventors: Xiaojie Xu, Union City, CA (US); Kyoung Eun Kweon, Pleasonton, CA (US); Christine A. Orme, Oakland, CA (US); Babak Sadigh, Union City, CA (US); April Sawvel, Union City, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 133 days.

(21) Appl. No.: 17/587,885

(22) Filed: Jan. 28, 2022

(65) Prior Publication Data
US 2022/0243352 A1    Aug. 4, 2022

Related U.S. Application Data

(60) Provisional application No. 63/143,271, filed on Jan. 29, 2021.

(51) Int. Cl.
C25D 13/02     (2006.01)
C01G 21/00     (2006.01)
(Continued)

(52) U.S. Cl.
CPC .............. C25D 13/02 (2013.01); C01G 21/00 (2013.01); C09K 11/661 (2013.01); C23C 2/04 (2013.01);
(Continued)

(58) Field of Classification Search
CPC ........ C25D 13/02; C25D 13/12; C25D 13/22; C01G 21/00; C01G 27/006; C01G 25/006;
(Continued)

(56) References Cited

U.S. PATENT DOCUMENTS 10,732,480 B2    8/2020  Han et al.
2013/0221279 A1*  8/2013  Xu .......................... H01B 1/00
                                                    252/301.36
(Continued)

FOREIGN PATENT DOCUMENTS

WO        2018169627 A2    9/2018

OTHER PUBLICATIONS

Webber et al ("Ligand Exchange on Colloidal CdSe Nanocrystals Using Thermally Labile tert-Butylthiol for Improved Photocurrent in Nanocrystal Films", J. Am. Chem. Soc., 2012, 134, p. 1085-1092) (Year: 2012).*

(Continued)

Primary Examiner — Xiuyu Tai
(74) Attorney, Agent, or Firm — Zilka-Kotab, P.C.

(57) ABSTRACT

A method includes at least partially submerging a substrate in a colloidal mixture of nanocrystals and a first solvent. The nanocrystals have first ligands coupled thereto. The method also includes applying an electric field to the colloidal mixture to form a solvated nanocrystal film and removing the solvated nanocrystal film from the first solvent. The method further includes applying a second solvent to the solvated nanocrystal film for ligand exchange. The second solvent comprises second ligands. A nanocrystal film product formed by one-step ligand exchange includes at least one dimension greater than 100 nm and ordered nanocrystals characterized as having a domain size of greater than 100 nm.

19 Claims, 17 Drawing Sheets

(51) Int. Cl.
| | |
|---|---|
| *C09K 11/66* | (2006.01) |
| *C23C 2/04* | (2006.01) |
| *B82Y 20/00* | (2011.01) |
| *B82Y 40/00* | (2011.01) |

(52) U.S. Cl.
CPC ............... *B82Y 20/00* (2013.01); *B82Y 40/00* (2013.01); *C01P 2004/64* (2013.01); *C01P 2006/60* (2013.01)

(58) Field of Classification Search
CPC ......... C01G 25/02; C09K 11/661; C23C 2/04; B82Y 20/00; B82Y 40/00; B82Y 30/00; C01P 2004/64; C01P 2006/60; C01P 2006/40; H01L 31/0324; H01L 21/02422; H01L 21/02628; H01L 21/02568; H01L 21/02491; H01L 21/02554; H01L 21/02601; H01L 31/035236; H01L 31/036; C30B 30/02; C30B 33/02; C30B 29/54; C30B 29/68; C30B 29/02; C30B 7/10; C30B 33/00; C30B 29/16; C30B 29/22; C30B 7/14; H01B 1/00; H10K 85/40; Y10S 977/896; Y10S 977/932; Y10S 977/774
See application file for complete search history.

(56) References Cited

U.S. PATENT DOCUMENTS

| | | |
|---|---|---|
| 2019/0004390 A1 | 1/2019 | Han et al. |
| 2021/0140068 A1 | 5/2021 | Yu et al. |
| 2021/0184364 A1 | 6/2021 | Han et al. |

OTHER PUBLICATIONS

Boles et al., "Self-Assembly of Colloidal Nanocrystals: From Intricate Structures to Functional Materials," Chemical Reviews, vol. 116, 2016, pp. 11220-11289.
Talapin et al., "Prospects of Colloidal Nanocrystals for Electronic and Optoelectronic Applications," Chemical Reviews, vol. 110, No. 10, 2010, pp. 389 458.
Kovalenko et al., "Prospects of Nanoscience with Nanocrystals," Nano Focus, ACS Nano, vol. 9, No. 2, 2015, pp. 1012-1057.
Erdem et al., "Colloidal nanocrystals for quality lighting and displays: milestones and recent developments," Nanophotonics, 2016, pp. 1-22.
Keuleyan et al., "Mid-infrared HgTe colloidal quantum dot photodetectors," Nature Photonics, vol. 5, Aug. 2011, pp. 489-493.
Kagan et al., Charge transport in strongly coupled quantum dot solids, Nature Nanotechnology, Nov. 2015, pp. 1-14.
Cui et al., ""What Should the Density of Amorphous Solids Be?"" The Journal of Chemical Physics, vol. 151, Nov. 2019, 12 pages.
Sainato et al., "Long-Range Order in Nanocrystal Assemblies Determines Charge Transport of Films," ACS Omega, vol. 2, 2017, pp. 3681-3690.
Abelson et al., "Collective topo-epitaxy in the self-assembly of a 3D quantum dot superlattice," Nature Materials, vol. 19, No. 1, Oct. 2014, 10 pages.
Peters et al., "Ligand-Induced Shape Transformation of PbSe Nanocrystals," Chemistry of Materials, vol. 29, 2017, pp. 4122-4128.
Law et al., "Structural, Optical, and Electrical Properties of PbSe Nanocrystal Solids Treated Thermally or with Simple Amines," Journal of the American Chemical Society, vol. 130, 2008, pp. 5974-5985.
Besra et al., "A review on fundamentals and applications of electrophoretic deposition (EPD)," Progress in Materials Science, vol. 52, 2007 pp. 1-61.
Boccaccini et al., "The Electrophoretic Deposition of Inorganic Nanoscaled Materials," Journal of the Ceramic Society of Japan, vol. 114, 2006, pp. 1-14.
Yu et al., "Reversible, Tunable, Electric-Field Driven Assembly of Silver Nanocrystal Superlattices," Nano Letters, vol. 17, 2017, 27 pages, retrieved from https://www.osti.gov/pages/biblio/1470709.
Yu et al., "Space- and time-resolved small angle X-ray scattering to probe assembly of silver nanocrystal superlattices," Nature Communications, 2018, 9 pages.
Yu et al., "Self-Assembly and Thermal Stability of Binary Superlattices of Gold and Silicon Nanocrystals," The Journal of Physical Chemistry Letters, vol. 4, 2014, pp. 1-11.
Rodriguez-Rodriguez et al., "Synthesis, characterization and electrochemical characterization of lead selenide sub-micron particles capped with a benzoate ligand and prepared at different temperatures," Materials Research Express, vol. 1, 2014, 15 pages.
Konstantatos et al., "Ultrasensitive solution-cast quantum dot photodetectors," Nature, vol. 442, Jul. 13, 2006, pp. 180-183.
Chen et al., "New concept ultraviolet photodetectors," Materials Today, vol. 18, No. 9, Nov. 2015, pp. 493-502.
Weng et al., "CdS/PbSe heterojunction for high temperature mid-infrared photovoltaic detector applications," Applied Physics Letters, vol. 104, 2014, 6 pages.
Tan et al., "Single-Crystalline InGaAs Nanowires for Room-Temperature High-Performance Near-Infrared Photodetectors," Nano-Micro Letters, vol. 8, 2016, pp. 29-35.
Chandra et al., "Adsorption of 3-Thiophene Carboxylic Acid on Silver Nanocolloids: FTIR, Raman, and SERS Study Aided by Density Functional Theory," The Journal of Physical Chemistry C, vol. 115, Jul. 2011, pp. 14309-14324.
Ilavsky et al., "Irena: tool suite for modeling and analysis of smallangle scattering," Journal of Applied Crystallography, vol. 42, 2009, pp. 347-353.
Sarasqueta et al. "Effect of Solvent Treatment on Solution-Processed Colloidal PbSe Nanocrystal Infrared Photodetectors," Chemistry of Materials, vol. 22, pp. 3496-3501.
Yu et al., U.S. Appl. No. 16/491,849, filed Sep. 6, 2019.
Han et al., U.S. Appl. No. 15/636,513, filed Jun. 28, 2017.
Han et al., U.S. Appl. No. 16/712,812, filed Dec. 12, 2019.
Stolle et al., Nanocrystal photovoltaics: a review of recent progress, Current Opinion in Chemical Engineering, ScienceDirect, vol. 2, 2013, pp. 160-167.
Konstantatos et al., "Colloidal quantum dot photodetectors," Infrared Physics & Technology, vol. 54, 2011, pp. 278-282.
Weidman et al., "Interparticle Spacing and Structural Ordering in Superlattice PbS Nanocrystal Solids Undergoing Ligand Exchange," Chemistry of Materials, vol. 27, 2015, pp. 474-482.
Choi et al., "Bandlike Transport in Strongly Coupled and Doped Quantum Dot Solids: A Route to High-Performance Thin-Film Electronics," Nano Letters, vol. 12, 2012, pp. 2631-2638.
Li et al., "Decoding the Superlattice and Interface Structure of Truncate PbS Nanocrystal-Assembled Supercrystal and Associated Interaction Forces," Journal of the American Chemical Society, vol. 136, 2014, pp. 12047-12055.
Guyot-Sionnest et al., "Colloidal quantum dots for infrared detection beyond silicon," The Journal of Chemical Physics, vol. 151, 2019, pp. 060901-1-060901-8.
Nakotte et al., "PbE (E = S, Se) Colloidal Quantum Dot-Layered 2D Material Hybrid Photodetectors," Nanomaterials, vol. 10, 2020, pp. 1-23.
Liu et al., "Dependence of Carrier Mobility on Nanocrystal Size and Ligand Length in PbSe Nanocrystal Solids," Nano Letters, vol. 10, 2010, pp. 1960-1969.
Brown et al., "Energy Level Modification in Lead Sulfide Quantum Dot Thin Films through Ligand Exchange," ACS Nano, vol. 8, No. 6, 2014, pp. 5863-5872.

* cited by examiner

LIGAND EXCHANGE OF NANOCRYSTAL FILMS

RELATED APPLICATIONS

This application claims priority to Provisional U.S. Appl. No. 63/143,271 filed on Jan. 29, 2021, which is herein incorporated by reference.

This invention was made with Government support under Contract No. DE-AC52-07NA27344 awarded by the United States Department of Energy. The Government has certain rights in the invention.

FIELD OF THE INVENTION

The present invention relates to ligand exchange, and more particularly, this invention relates to ligand exchange of 3-dimensional (3D) nanocrystal films.

BACKGROUND

Colloidal semiconductor nanocrystals (NCs) have many applications due to their tunable band gaps and low-cost, low-temperature processing methods. However, controlling the deposition of the nanocrystal films into ordered, compact films is a central challenge in further developing these applications. Ligand exchange on the NCs is performed to tune the various properties of a film of NCs. Conventional techniques for preserving structural order following ligand exchange are relatively time consuming, require meticulous control, and are limiting with respect to the thickness for NC films.

SUMMARY

A method, according to one aspect, includes at least partially submerging a substrate in a colloidal mixture of nanocrystals and a first solvent. The nanocrystals have first ligands coupled thereto. The method also includes applying an electric field to the colloidal mixture to form a solvated nanocrystal film and removing the solvated nanocrystal film from the first solvent. The method further includes applying a second solvent to the solvated nanocrystal film for ligand exchange. The second solvent comprises second ligands.

A nanocrystal film product formed by one-step ligand exchange, according to one aspect, includes at least one dimension greater than 100 nm and ordered nanocrystals characterized as having a domain size of greater than 100 nm.

Other aspects and advantages of the present invention will become apparent from the following detailed description, which, when taken in conjunction with the drawings, illustrate by way of example the principles of the invention.

DETAILED DESCRIPTION

Figure 1:
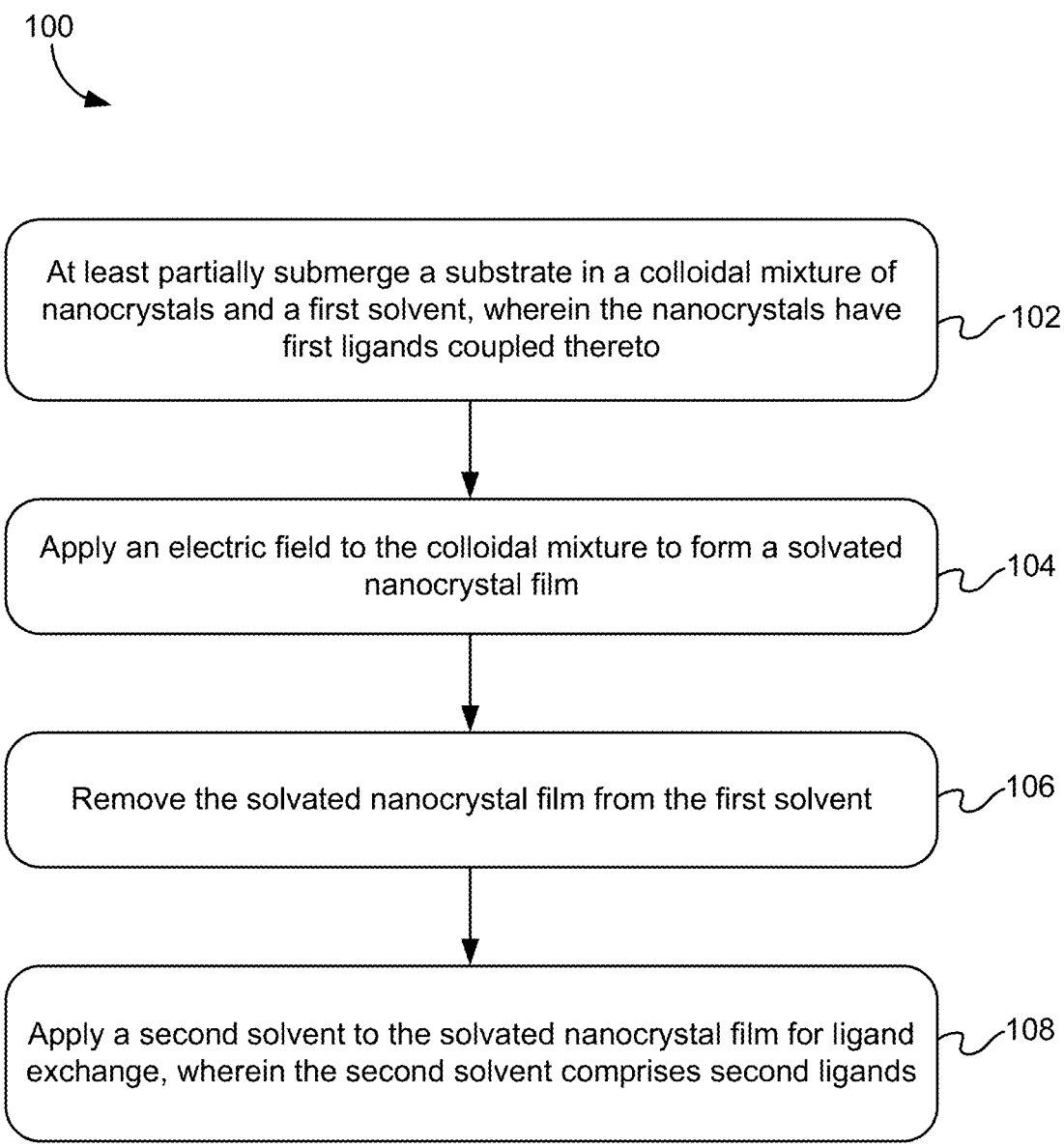
FIG. 1 is a flowchart of a method, in accordance with one aspect of the present invention.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of ligand exchange of 3-dimensional (3D) nanocrystal films and/or related products and methods.

In one general embodiment, a method includes at least partially submerging a substrate in a colloidal mixture of nanocrystals and a first solvent. The nanocrystals have first ligands coupled thereto. The method also includes applying an electric field to the colloidal mixture to form a solvated nanocrystal film and removing the solvated nanocrystal film from the first solvent. The method further includes applying a second solvent to the solvated nanocrystal film for ligand exchange. The second solvent comprises second ligands.

In another general embodiment, a nanocrystal film product formed by one-step ligand exchange includes at least one dimension greater than 100 nm and ordered nanocrystals characterized as having a domain size of greater than 100 nm.

The following description discloses several preferred embodiments of one-step ligand exchange of 3D nanocrystal films for electronic and optoelectronic devices. One-step ligand exchange of 3D nanocrystal films refers to ligand exchange substantially throughout a desired thickness of the nanocrystal layer via a single process. The single process preferably includes an initial deposition of the nanocrystals for forming a solvated nanocrystal film and a single submersion of the solvated nanocrystal film into a ligand exchange solution to form the resulting nanocrystal film product having the desired thickness. The one-step ligand exchange as described herein is in contrast to various conventional techniques for forming nanocrystal films which require multi- and/or repeated steps for forming a desired thickness, as described in detail below.

Colloidal semiconductor nanocrystals (NCs), due to their tunable band gaps and low-cost, low-temperature processing methods, have attracted attention from both academia and industry. Recent studies have highlighted their versatility and potential in a range of electronic and optoelectronic devices, including sensors, solar cells, light emitting diodes, and photodetectors. Controlling the deposition of nanocrystal films into ordered compact films is a central challenge. This is exacerbated by the use of the shell of organic ligands that passivate the NC exterior, to be exchanged for shorter ligands that favor charge transport, as used in conventional approaches.

Various aspects of the present disclosure describe a process that speeds up the ligand exchange process without destroying the film order. There are several challenges to be progressively addressed to transition from the size-tunable properties of an individual semiconductor nanocrystal to the collective physics properties of a "bulk-like" nanocrystal semiconductor film and thereby realize the optimal electronic and optoelectronic properties. First, the interparticle spacing, which affects how electrons transport from one nanocrystal to another, is primarily determined by the length of ligands. Most recent progress on nanocrystal devices has focused on replacing the long insulating ligands associated with synthesis (e.g., about 2-3 nm) with shorter ligand chains (e.g., about 0.5-1.5 nm). Reducing the interparticle spacing has led to significant enhancements in carrier mobilities and conductivities of the ligand-exchanged nanocrystal films. Within the effective ligand lengths, the second key factor that impacts electronic properties is structural ordering. Akin to the "high crystallinity" in a conventional semiconductor film, long-range order in a nanocrystal film will result in a higher carrier mobility due to stronger electronic coupling. In addition, a well-ordered lattice structure typically has a packing density that is about 10% to about 15% higher than that of an amorphous (e.g., glassy) structure. Higher packing density enables greater light absorption for thinner films, which simultaneously increases absorption and reduces electron-hole transport distances, both of which are beneficial for optoelectronic properties. However, preserving structural order after ligand exchange is challenging due to the large reduction in lattice constant. For replacing relatively longer ligands with relatively shorter ligands, the spacing between the nanocrystals becomes more compact. Even if the film starts as being relatively "open" (e.g., the spacing allows solutions to penetrate the film), as the relatively long ligands are replaced with relatively shorter ligands, the NC films begin to contract, thereby increasing the difficulty for the solution to penetrate the film and complete the ligand exchange throughout the film. At least some aspects describe a generalizable method for ordering semiconductor nanocrystal films and retaining order during ligand exchange.

Conventional strategies to perform ligand exchange for a nanocrystal film may be categorized as solid state ligand exchange and interfacial ligand exchange. For solid state ligand exchange, there are two primary conventional approaches: the first method deposits a nanocrystal film with the desired thickness onto a substrate and then soaks the film in a ligand solution for an extended period of time; the second method takes a layer-by-layer approach, in which cycles of a thin layer deposition and ligand exchange are repeated to build up the desired thickness. The former process is slow (hours to days) and limited either to thin films or incomplete exchange, while the latter requires meticulous control over the evaporation rate and time for each step to preserve nanocrystal ordering. Interfacial ligand exchange assembles a thin layer of nanocrystals on the surface of a liquid and then injects the ligand solution into the liquid phase to induce ligand replacement, followed by stamp transfer to a solid substrate. Similarly, meticulous control from assembly to film transfer is required to retain the long-range order of the nanocrystals and to integrate the film into a device structure. Defects (e.g., ripples, rips, etc.) are easily introduced into the films during the transfer process. Further, these conventional techniques are limited to films that are typically less than 100 nm in thickness. Therefore, a facile and effective method to exchange the ligands while retaining the structural ordering of a nanocrystal film is urgently needed. Furthermore, one of the trends for next-generation electronics is flexible and lightweight devices. Flexible high performance quantum dot (QD) based optoelectronic devices would be useful for both academic and industry applications.

At least some aspects of the present disclosure include a strategy to perform one-step rapid ligand exchange through a solvated superlattice that preserves long-range order. This approach takes advantage of aspects of both solid-state ligand exchange, which allows ordered films to be deposited directly onto device substrates, and interfacial exchange, which allows NCs to re-order during ligand exchange. At least some approaches provide the ability to make comparable films with ordered and disordered structures. At least some aspects may be used to directly compare the effect of order on optoelectronic properties in a simple planar photodetector device structure. The optoelectronics properties of two different conjugated ligands may be compared, in some approaches.

Various approaches of the present disclosure include at least partially submerging a substrate into a colloidal mixture of nanocrystals, where the nanocrystals have relatively longer first ligands coupled thereto, in a first solvent. The nanocrystals form a relative loose nanocrystal film (e.g., a solvated nanocrystal film, to be described in further detail below). A loose nanocrystal film may be characterized by a relatively larger lattice constant compared to that of the dry film after the solvent evaporates; for instance, the solvated superlattice may have a lattice constant that is in the range of about 10% to about 20% larger than the dry superlattice film. For example, a superlattice composed of Ag nanocrystals (with an average size of ~7 nm) prepared by electrophoretic deposition has a lattice constant of 15.5 nm in the solvated state and 13.5 nm in the dry state. Compared to conventional techniques that perform ligand exchange on dry films, the more open solvated nanocrystal film created by the present approach allows more movement into the film. The loose nanocrystal film may be interchangeably referred to as a solvated nanocrystal film throughout the present disclosure. The solvated nanocrystal film (comprising the first ligands) is at least partially submerged in a second solvent mixture comprising relatively shorter second ligands for performing ligand exchange. The one-step ligand exchange occurs in a relatively short period of time (e.g., about 2 to 3 minutes) which advantageously improves upon the time-consuming conventional techniques known in the art. At least some aspects of the present disclosure incorporate aspects of electric field driven assembly as described in WO2018169627A2, priority date of Mar. 15, 2017 (and corresponding U.S. patent application Ser. No. 16/491,849 filed Sep. 6, 2019), which are herein incorporated by reference.

FIG. 1 is a flowchart of a method 100, in accordance with one embodiment. As an option, the present method 100 may be implemented in various aspects, such as those shown in the other FIGS. described herein. Of course, however, this method 100 and others presented herein may be used to in various approaches which may or may not be related to the illustrative embodiments listed herein. Further, the methods presented herein may be carried out in any desired environment. Moreover, more or less operations than those shown in FIG. 1 may be included in method 100, according to various embodiments. It should also be noted that any of the aforementioned features may be used in any of the embodiments described in accordance with the various methods.

Method 100 includes step 102. Step 102 includes at least partially submerging a substrate in a colloidal mixture of nanocrystals and a first solvent. The nanocrystals preferably have first ligands coupled thereto. According to various aspects of the present disclosure, a nanocrystal may be a material particle having at least one dimension less than or equal to 100 nm, as would be understood by one having ordinary skill in the art. In some approaches, a nanocrystal may have at least one dimension which is about 10-20 nm. In preferred aspects, the size of the nanocrystal is such that the nanocrystals remain colloidally dispersed in the first solvent. The nanocrystal material may be semi-conducting materials (e.g., PbSe, PbS, CdSe, CdTe, perovskites etc.), metals (e.g., Ag, Au, Ni, etc.), oxides (e.g., $SiO_2$, $TiO_2$, etc.), etc.

Exemplary substrate materials may include any substrates with reasonable conductivity, including silicon substrates (e.g., silicon-based materials), metal substrates (e.g., metal-based materials), indium tin oxide (ITO) coated substrates, etc. ITO coated substrates may include glass, polyethylene terephthalate (PET), etc. In addition, this method may also be used to deposit materials on flexible substrates for wearable applications, e.g., metal wires, ITO coated PET, conductive fabric/cloth, etc.

In preferred aspects, the concentration of the nanocrystals in the first solvent may be in the range of about 2 mg/mL to about 50 mg/mL. In other aspects, the concentration of the nanocrystals in the first solvent may be in the range of about 2 mg/mL to about 40 mg/mL. The first solvent is preferably not supersaturated with the nanocrystals; rather the nanocrystals become supersaturated at the substrate when the electric field is applied to the nanocrystals in the first solvent, as described below.

Step 104 includes applying an electric field (e.g., an electric field in a range of about 0.1 V/cm to about 30 V/cm) to the colloidal mixture to form a solvated nanocrystal film, the deposition time may range from seconds to hours. The nanocrystals become ordered into a relatively loose nanocrystal film on the substrate in response to an electric field being applied using a pair of electrodes in the colloidal mixture. Because of the charge on the surface of the nanocrystals, the nanocrystals are attracted to the substrate, saturate near the substrate, and form an ordered, but loose nanocrystal superlattice film.

Step 106 includes removing the solvated nanocrystal film from the first solvent. The solvated nanocrystal film may be physically removed from the first solvent and placed in the second solvent (e.g., as in step 108 below) in some approaches. In other approaches, the solvated nanocrystal film is part of a flow set up which exchanges the first solvent for the second solvent in a manner known in the art.

Step 108 includes applying a second solvent to the solvated nanocrystal film for ligand exchange. The second solvent comprises second ligands. The solvated nanocrystal film as described herein advantageously allows the second solvent having the second ligands (e.g., the relatively shorter ligands) to be able to diffuse in and diffuse out of the film of nanocrystals having the first ligands (e.g., the relatively longer ligands) for ligand exchange more readily than any other nanocrystal film ligand exchange technique known in the art.

In at least some aspects, a second electric field is applied to the solvated nanocrystal film during and/or after the application of the second solvent. The second electric field may be characterized as having the same or different charge, duration, etc., from the electric field applied in step 104. In various approaches, a bias of the electric field of may be maintained or adjusted in a manner which would be become apparent to one having ordinary skill in the art upon reading the present disclosure.

In various aspects, following the ligand exchange, the resulting film of nanocrystals (comprising the second ligands) is withdrawn from the second solvent. Excess second solvent remaining on and/or in the nanocrystal film may be evaporated and/or rinsed from the nanocrystal film.

Surprisingly, the inventors have improved upon conventional ligand exchange by discovering the benefits of having a first solvent which is relatively similar to the second solvent. For example, by varying the ratio of a first component and a second component in the first solvent compared to the ratio of the first component and the second component in the second solvent, or vice versa, the ordering of the lattice structure comprising the nanocrystal may be significantly improved. In various approaches, the first solvent and/or the second solvent may comprise toluene and acetonitrile wherein toluene may be the first component and acetonitrile is the second component, or vice versa. In some approaches, toluene may be replaced with another non-polar solvent such as hexane, benzene, carbon tetrachloride, etc. In other approaches, acetonitrile may be replaced with another polar solvent such as ethanol, ethyl acetate, polypropylene carbonate, etc. In preferred approaches, the first component and the second component of the first solvent are miscible, polar/non-polar pairs. Similarly, in preferred approaches, the first component and the second component of the second solvent are miscible, polar/non-polar pairs. In some approaches, the first component and/or the second component of the first solvent are different than the first component and/or the second component of the second solvent, but in other approaches, the first and/or the second solvents may use the same first and/or second components. In some aspects, additives including methanol, dimethyl sulfoxide (DMSO), 2,6-difluoropyridine, etc., may be included in the first solvent and/or the second solvent for tuning the ligand exchange, as different ligands have different solubility properties in different solvents. When selecting solvent combinations and/or additives for ligand exchange, the factors which may be taken into consideration are the combination of miscible, polar and non-polar solvents that increase the solubility of the ligand while maintaining some solubility of the nanocrystal with native ligands. This tuning allows the ligands to be dissolved into the solvent but allows the nanocrystals to adjust their positions as the lattice constant is reduced.

As discussed above, the ratio of the first component and the second component may be varied to improve and/or tune the ordering of the nanocrystal films. The ratio of the first component and the second component in the first solvent (e.g., for the original deposition of the nanocrystals onto the substrate for forming the solvated nanocrystal film) may be in the range of about 12% to about 200%. For the ligand exchange solution (e.g., the second solvent), the ratio of the first component to second component may be in the range of about 10% to about 200%.

Advantageously, the resulting nanocrystal film product formed by the one-step ligand exchange is a relatively thick, well-ordered film compared to films produced by conventional techniques. The nanocrystal film is preferably in the range of about 50 nm to about 500 nm in at least one direction. In preferred aspects, the nanocrystal film is at least 100 nm in at least one direction (e.g., preferably a thickness measured perpendicular to a plane which is parallel to the surface of the nanocrystal film). In other approaches, the nanocrystal film can be greater than or equal to about 500 nm (e.g., about 1 µm to about 2 µm) in at least one direction. A nanocrystal, as used throughout the present disclosure, may refer to a homogeneous solid substance having a natural geometrically regular form with symmetrically arranged plane faces. According to various aspects of the present disclosure, a nanocrystal may be a material particle having at least one dimension between about 1 nm to 100 nm. In some exemplary aspects, the at least one dimension of the nanocrystal refers to a diameter of the nanocrystal. The well-ordered nature of the nanocrystal film may be characterized as the nanocrystals having a domain size of about 100 nm to about 300 nm or larger. As referred to in the present disclosure, the domain size refers to the size of a single crystal inside a film. The domain size of the nanocrystal may refer to a region within the film product (e.g., around the nanocrystal) which has similar structures, phases, properties, etc., as the nanocrystal.

The resulting nanocrystal film on the substrate following the one-step ligand exchange may be used on the substrate for various of the applications described herein. In other approaches, the nanocrystal film may be delaminated from the substrate before use. In yet other approaches, the substrate may be dissolved in a manner which detaches the nanocrystal film for use in various applications.

While much of the present description discusses PbSe nanocrystal films, this has been done by way of example only, and it is to be understood that similar results are expected for nanocrystal films formed from other nanocrystal materials and/or compositions described herein.

Experimental Details

PbSe NC films are promising candidates for many optoelectronic applications including infrared (IR) photodetectors due to their highly-refined synthesis and tunable band gap ranges (0.35 eV to 1.4 eV). While there have been numerous reports on the use of colloidal PbSe quantum dots for IR detectors, there have been comparatively few reports on PbSe NCs. Current literature has focused on improving the performance of a PbSe nanocrystal IR photodetector by replacing the native ligands (oleic acid) with shorter ligands that have dithiol groups or introducing carrier block layers to impede charge injection under reverse bias. However, none of these studies managed to preserve the superlattice structure after chemical treatment of the PbSe NCs. A well-ordered 3D superlattice structure reduces positional disorder thereby increasing localization length and is therefore expected to correlate with higher carrier mobility and faster response compared to a disordered assembly.

To the best of the inventors' knowledge, the present disclosure is the first report to realize rapid one-step ligand exchange through a thick 3D NC superlattice film. The inventors have advantageously demonstrated that long-range ordering greatly boosts the performance of PbSe NC photodetectors, leading to a high responsivity of 0.25 A/W at 1 V, which is more than an order of magnitude higher than that of a disordered film (0.015 A/W) and comparable to the state-of-art PbSe NC IR photodetectors. Ordered films also have a greater than or equal two times faster response time than those of disordered PbSe NC photodetectors.

One-Step Rapid Ligand-Exchange of a Solvated 3D Superlattice Nanocrystal Film

Electrophoretic deposition (EPD), which is the deposition of nanoparticles via application of an external electrical field, has been demonstrated to be an effective way to deposit nanocrystals onto substrates. However, most studies use EPD to form conformal coatings and report disordered, amorphous films. Expanding on this, various approaches disclosed herein use EPD for nanocrystal superlattice assembly.

Fast crystallization of 3D nanocrystal superlattices (NCSLs) using rapid field-driven assembly of Ag nanocrystal superlattices, included driving and supersaturating the NCs near the substrate while retaining their high mobility through the solvated environment. Ag NCSLs showed a 15.6% larger lattice constant in the solvated form than the dry state, which suggests a unique opportunity to perform solution ligand exchange through the 3D NCSL film while it is still solvated. Therefore, the methodology was adapted herein to form a 3D PbSe NCSL film via field-driven assembly.

Figure 2:
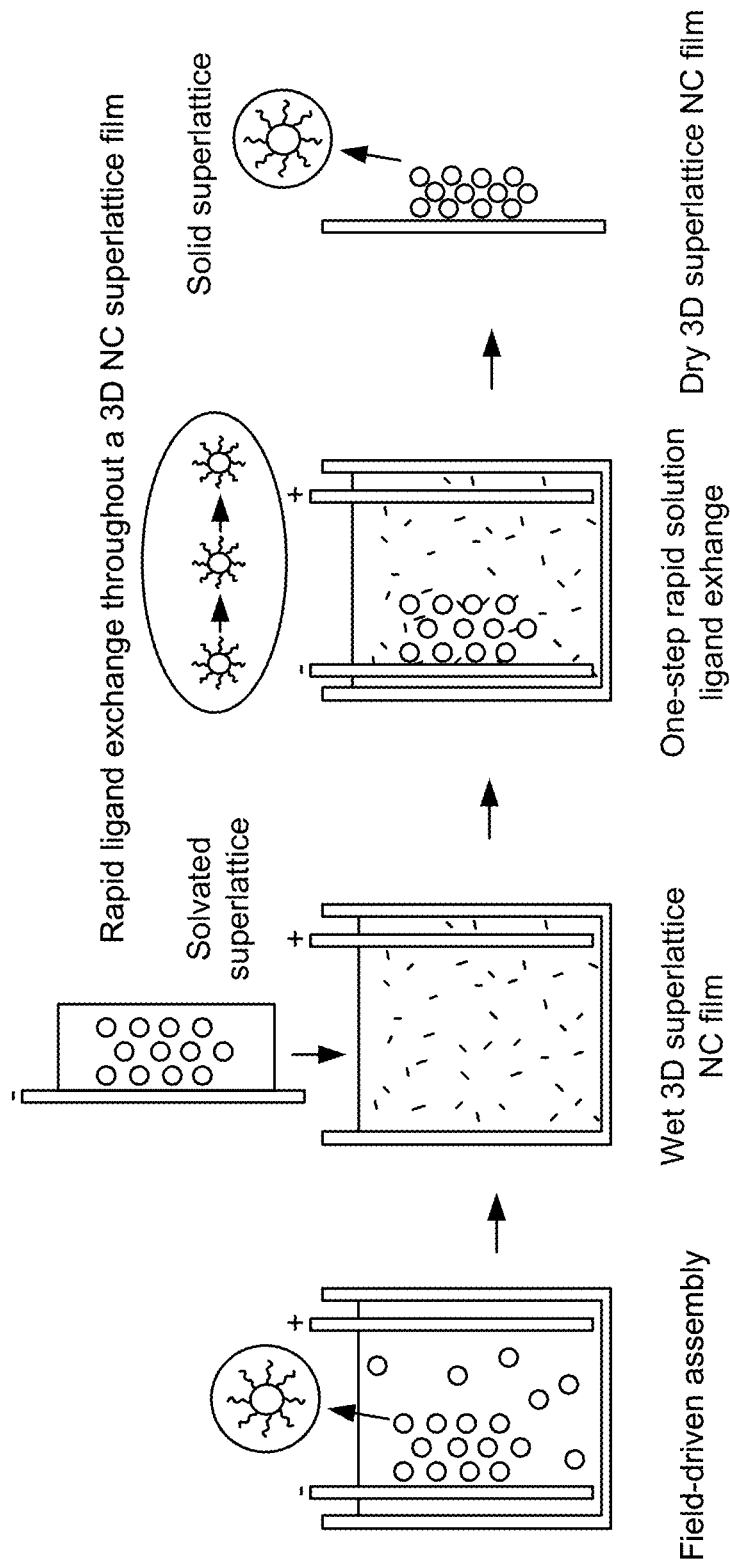
FIG. 2 is a schematic illustration of an exemplary one-step rapid solution ligand exchange process, in accordance with one aspect of the present invention.

FIG. 2 is an exemplary schematic illustration of the one-step rapid solution ligand exchange process, as described in various aspects above. As shown, PbSe NCs capped with native ligands (oleic acid) in a solvent mixture were first driven to the substrate by an external electric field (20 V/mm). The solvent mixture comprised toluene and acetonitrile, where the role of acetonitrile was to increase the dielectric constant of the solvent and surface charges of NCs so that they had higher mobility under the electric field. This process resulted in a well-ordered, yet solvated superlattice film that was adhered to the electrode. Subsequently, the wet and loosely-packed 3D NCSL film was transferred into a solution containing new ligands. A small bias between the electrodes (0.4 V/mm) was used to hold the solvated film to the substrate. This approach combines the advantages of solid-state ligand exchange, which directly deposits a NC film onto a device substrate, with in situ ligand exchange, which retains NC diffusion allowing re-ordering. To preserve a high degree of long-range order (average domain size of about 100 to about 250 nm) through a 3D NCSL film (about 100 to about 500 nm), the new ligands are dissolved in a solvent environment similar to that used in the assembly process. Finally, after this rapid one-step in situ ligand exchange process (about 2 to about 5 min), the film was taken out of the solution. With the evaporation of solvent, a dry ligand-exchanged 3D NCSL film is obtained.

Mesocrystal Order and Interparticle Spacing

Figure 3:
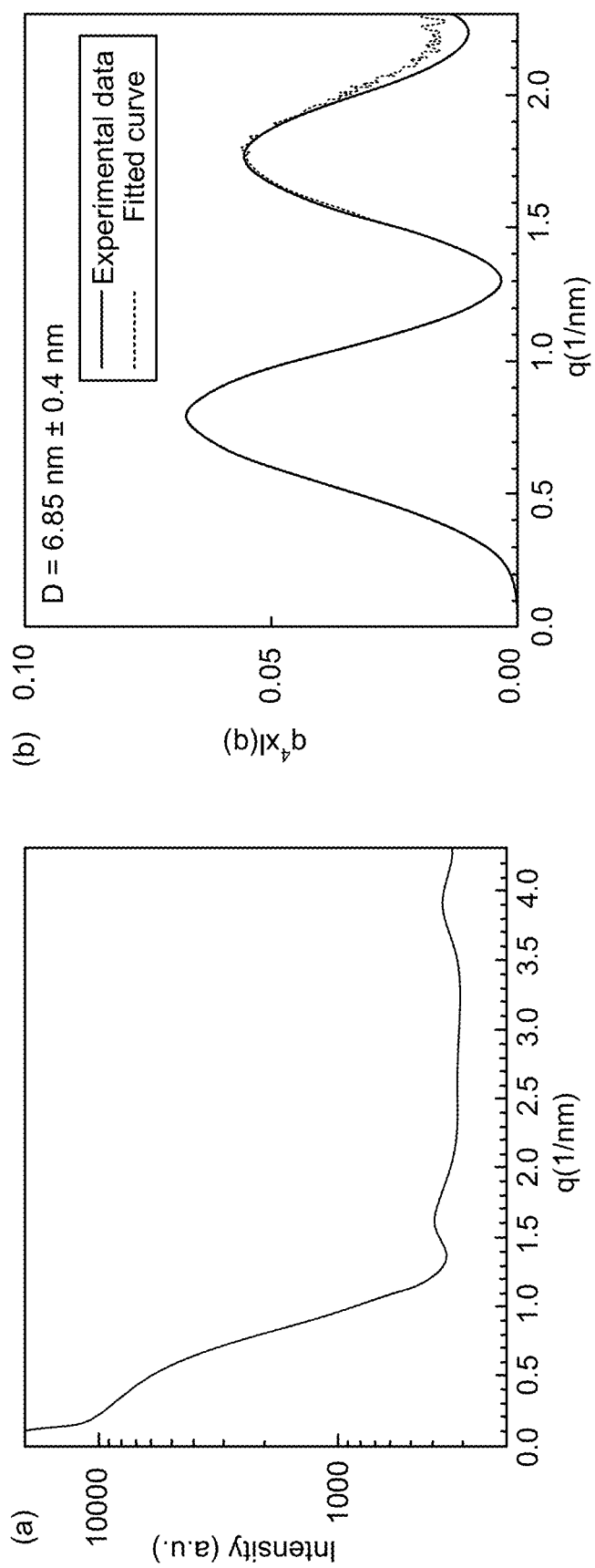
FIG. 3 is a small angle x-ray scattering (SAXS) of PbSe nanocrystals, in accordance with one aspect of the present invention.

To study the efficacy of the solvated ligand exchange process formed by processes described herein, the change in structural ordering and interparticle spacing of the films before and after ligand exchange was investigated. NC films were deposited using PbSe NCs that were capped with oleic acid (OA) from synthesis. The NCs have a core diameter of 6.85±0.4 nm as measured by small angle x-ray scattering as shown in FIG. 3 portion (a). FIG. 3 portion (b) includes Porod plots of the PbSe nanocrystals. The calculated PbSe diameter is 6.85 nm±0.4 nm. All the curves displayed in portions (a) and (b) had a background subtraction. The Porod plots were fitted with the assumption of gaussian distribution the of diameters. Benzoic acid (BA) was selected as a representative short ligand for ligand exchange studies. Scanning electron microscopy (SEM) and grazing incidence small-angle X-ray scattering (GISAXS) were used to characterize the morphology and degree of order of the 3D NC films.

Figure 4:
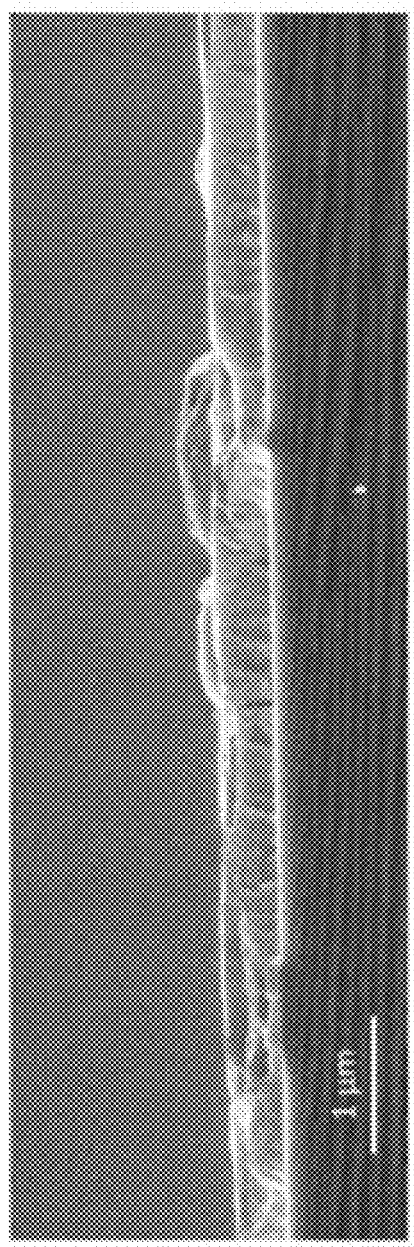
FIG. 4 is a cross-sectional scanning electron microscopy (SEM) image of a 3D PbSe superlattice NC (SLNC) film prepared via field-driven assembly, in accordance with one aspect of the present invention.
Figure 5:
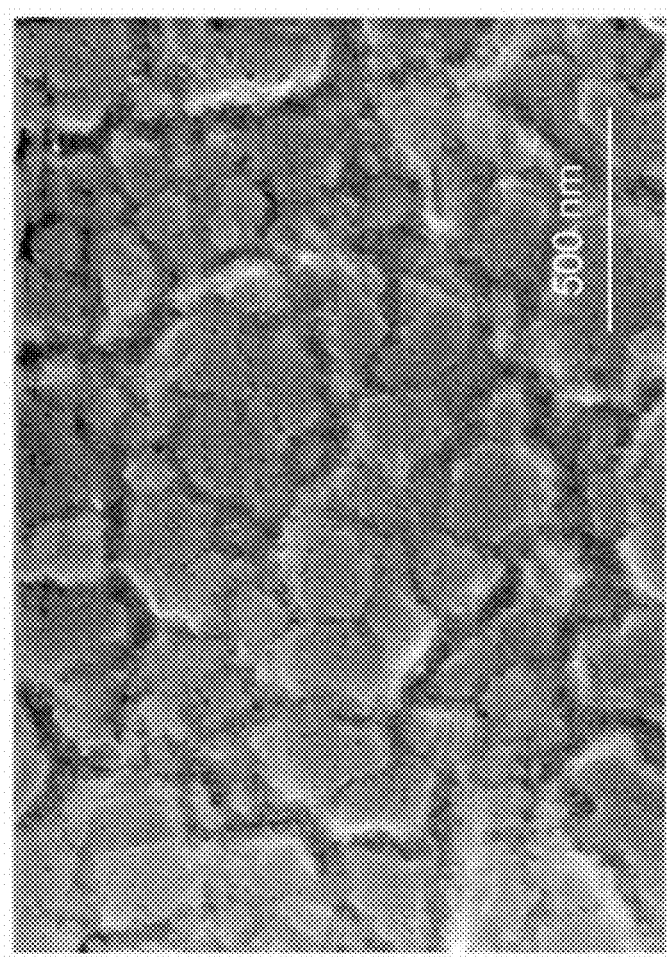
FIG. 5 is an SEM image showing the domain sizes of the 3D PbSe superlattice NC (SLNC) film with native ligand (oleic acid-OA) prepared via electrophoretic deposition, in accordance with one aspect of the present invention.
Figure 6:
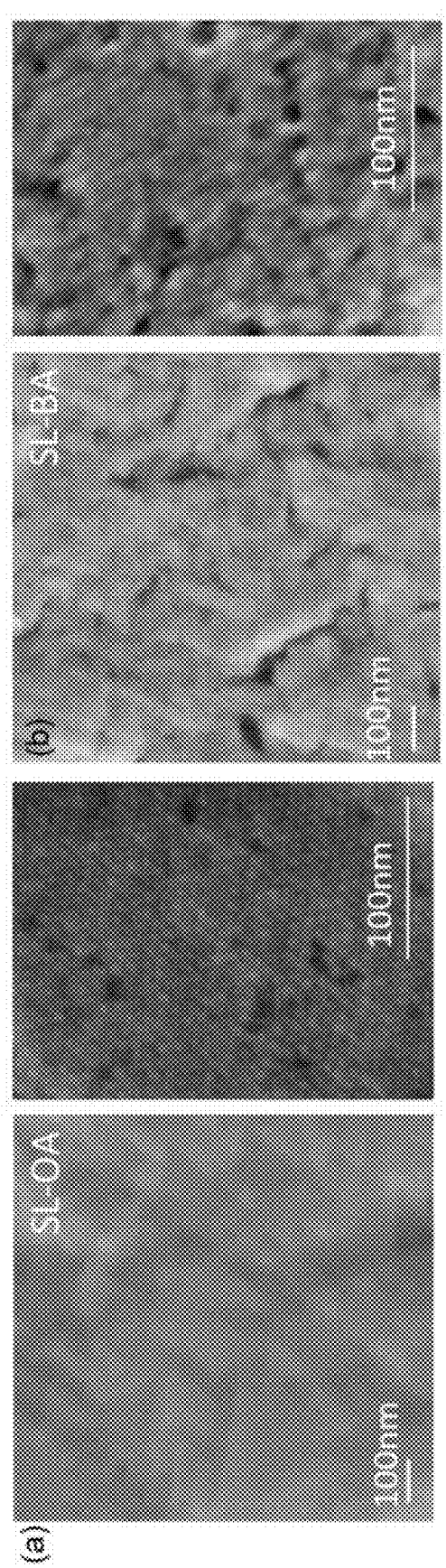
FIG. 6 includes SEM images of 3D PbSe superlattice NC (NCSL) films, in accordance with one aspect of the present invention.

Using electrophoretic deposition, a PbSe NC film with a thickness of about 500 nm (as shown in FIG. 4) and an average domain size of about 250 nm (as shown in FIG. 5) was formed on a silicon substrate within 10 min. In FIG. 6 portion (a), SEM images of the as-assembled PbSe NC film capped with native ligand oleic acid (PbSe-OA) show a continuous film with well-defined triangular facets, and the high-resolution SEM image reveals well-ordered nanocrystals with a hexagonal symmetry. FIG. 6 portion (a) includes SEM images of 3D PbSe superlattice NC (NCSL) film with native ligands (oleic acid-OA) prepared via electrophoretic deposition. FIG. 6 portion (b) includes SEM images of 3D PbSe superlattice NC film after ligand replacement with benzoic acid (BA) via one-step solution ligand exchange process. These images indicate that a highly ordered PbSe nanocrystals film was successfully fabricated.

Figure 7:
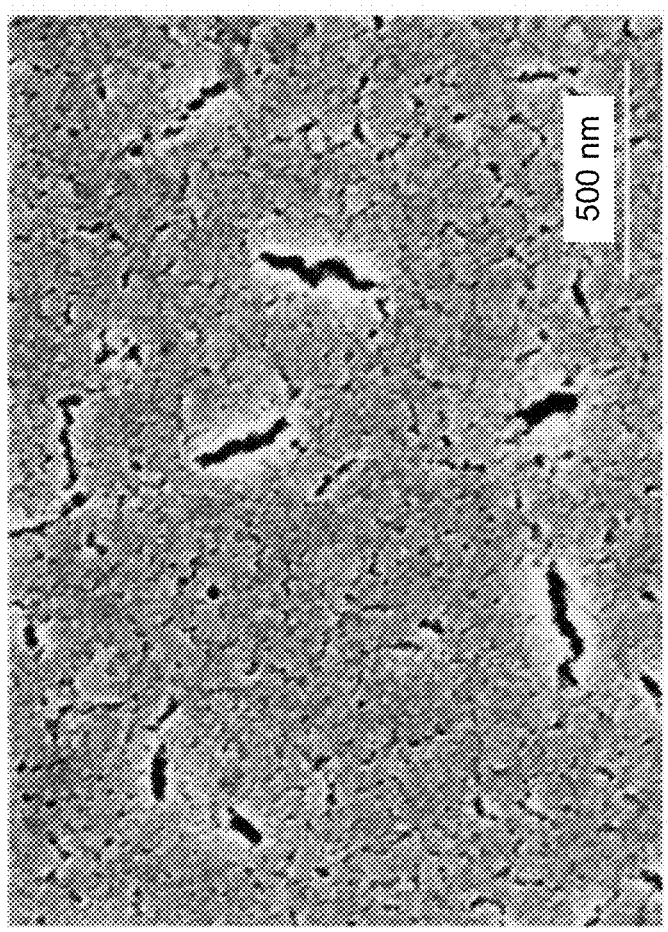
FIG. 7 shows formed micro-cracks in the 3D PbSe superlattice NC (SLNC) film after ligand exchange with benzoic acid via the one-step solution ligand exchange process, in accordance with one aspect of the present invention.
Figure 8:
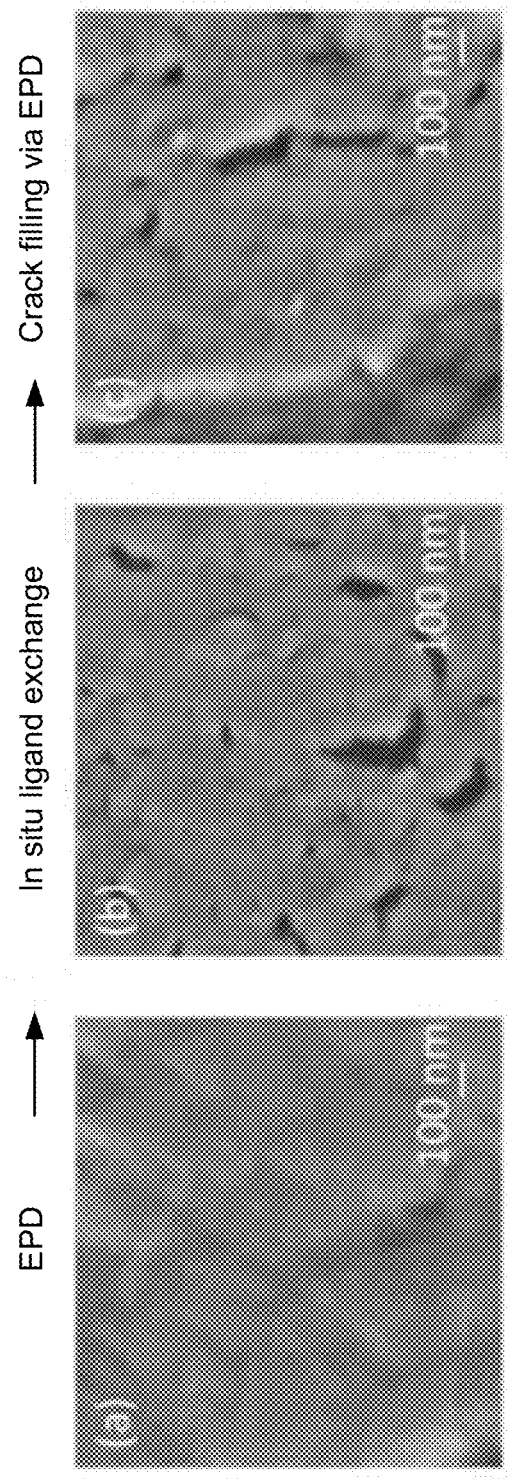
FIG. 8 includes SEM images of the PbSe NC film having the micro-cracks filled via an additional cycle of field-driven assembly and in situ ligand exchange, in accordance with one aspect of the present invention.

To prepare the ligand-exchanged film, oleic acid capped PbSe nanocrystals were first assembled onto the Si substrate via EPD. However, instead of removing and drying, as was done above, the film was immediately transferred into a solution containing benzoic acid and soaked for about 5 minutes before removing from solution and drying. This relatively in situ short ligand exchange process while the superlattice remained solvated was sufficient to exchange benzoic acid for oleic acid on the entire 500 nm thick PbSe NC films. The ligand exchanged film is denoted by PbSe-BA. As shown in the low-magnification SEM image in FIG. 6, triangular facets were still present, and long-range order (about 100 nm) of nanocrystals could also been seen from the high resolution SEM image. These images indicate that a remarkable degree of order was preserved after the one-step ligand exchange process. As expected, micro-cracks were formed due to the sudden volume loss associated with new ligands (as shown in FIG. 7). The micro-cracks may be filled by an additional cycle of field-driven assembly and in situ ligand exchange for device fabrication (as shown in FIG. 8 portions (a), (b), and (c)).

GISAXS measurements were used to obtain a more statistically representative sampling of the structural ordering before and after ligand exchange. GISAXS averages over millimeter square areas, which addresses concerns regarding local sampling inherent in imaging techniques and is one of the few techniques that can measure not just surface structure but also nanocrystal order into the depth of the film, which is essential for 3D films. GISAXS measurements were taken for PbSe-OA NC film prepared via EPD. The distinct diffraction spots were indexed to a face-centered cubic (fcc) superlattice with its (111) face oriented parallel to the substrate. However, the in-plane ($q_y$) and out-of-plane ($q_x$) diffraction spot positions were indexed independently leading to in-plane and out-of-plane lattice constants of 12.5 nm and 12.2±0.3 nm, respectively. The difference in the lattice constants in-plane and out-of-plane is generally attributed to the uniaxial contraction of nanocrystals towards the substrate during solvent evaporation. This technically describes a face-centered rhombohedral structure. The fcc nomenclature is retained so that it may be compared to literature values more readily. According to the integration of the GISAXS patterns by sector averaging of these films, the (200) facets shifted towards higher q by about 0.16 nm to about 1 nm with slight broadening of about 0.05 nm to about 1 nm after in situ ligand exchange, which indicates a reduction of lattice constant and domain sizes of the 3D NCSL films. In contrast, the peak centers of (200) of the control film aligned with those of the NCSL-BA one, except that there is more significant broadening of the diffraction with decreased intensities, which suggests a comparable interparticle spacing but a disordered structure.

Figure 9:
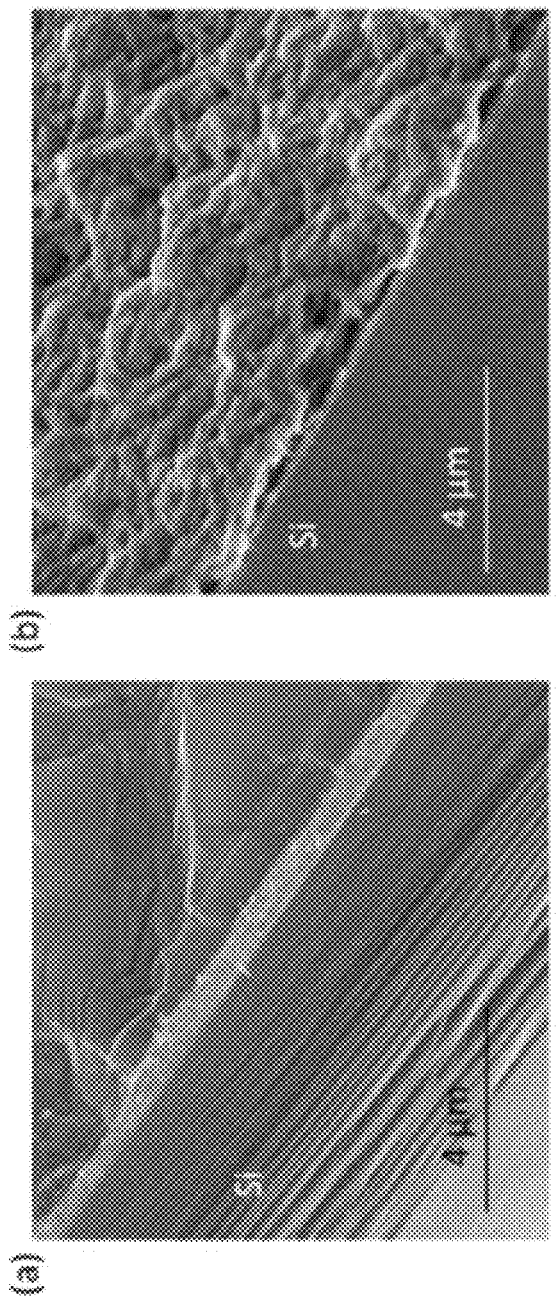
FIG. 9 includes SEM images of a 3D PbSe superlattice NC (SLNC) film after ligand exchange with benzoic acid via one-step solution ligand exchange process and a 3D PbSe superlattice NC (SLNC) film after layer-by-layer dip coating and ligand exchange process, in accordance with one aspect of the present invention.

After the in situ ligand exchange with benzoic acid, the corresponding GISAXS pattern of the PbSe-BA film includes well-defined fcc diffraction spots which were still present and the calculated in-plane and out-of-plane lattice constant from indexing were 11 nm and 10.6±0.4 nm. The GISAXS data suggests that after ligand exchange, the PbSe NCBA film still retained a superlattice structure but had a smaller lattice constant and interparticle spacing. For comparison, a control film with a comparable thickness was prepared via conventional methods using layer-by-layer dip coating and ligand exchange. The corresponding GISAXS pattern for the control film includes continuous diffraction rings instead of diffraction spots, which indicates that the film has only local order, and is not a superlattice, which can be further verified by the SEM images shown in FIG. 9. FIG. 9 includes SEM images of a 3D PbSe superlattice NC (SLNC) film after ligand exchange with benzoic acid via (a) one-step solution ligand exchange process and (b) layer-by-layer dip coating and ligand exchange process. The SEM images were taken with fractured samples at 45 degree so that both the top surface and cross section can be measured simultaneously. It is a challenge to retain long range order in a thick nanocrystal film by conventional dip coating and ligand exchange method.

To quantify the nanocrystal distance variation between the virgin state and after treatment with benzoic acid, the interparticle spacing was derived from the lattice constants using the following equation $$IPS = \frac{a}{\sqrt{2}} - d,$$

where IPS is the interparticle spacing, a is the lattice constant and d is the diameter of the nanocrystals. When oleic acid is replaced with benzoic acid using the ligand exchange process, the in-plane interparticle spacing is reduced from 2 nm to 0.93 nm, while the out-of-plane interparticle spacing is reduced from 1.80±0.2 nm to 0.65±0.28 nm.

Fourier-transform infrared spectroscopy (FTIR) was used to confirm the replacement of oleic acid by benzoic acid during ligand exchange. The decrease of the C—H stretching peaks of $CH_3$ at 2854.12 and 2925.48 $cm^{-1}$, associated with oleic acid and the increase in the of C=C aromatic stretch at 1593.02 and 1490.70 $cm^{-1}$, verifies the successful replacement with benzoic acid. These results combined with the morphology and structural order studies, suggest that the in situ solution ligand exchange process is a facile and effective method to perform ligand exchange while retaining the order of 3D nanocrystal films.

Optoelectronic Response of Planar Photodetector

Figure 10B:
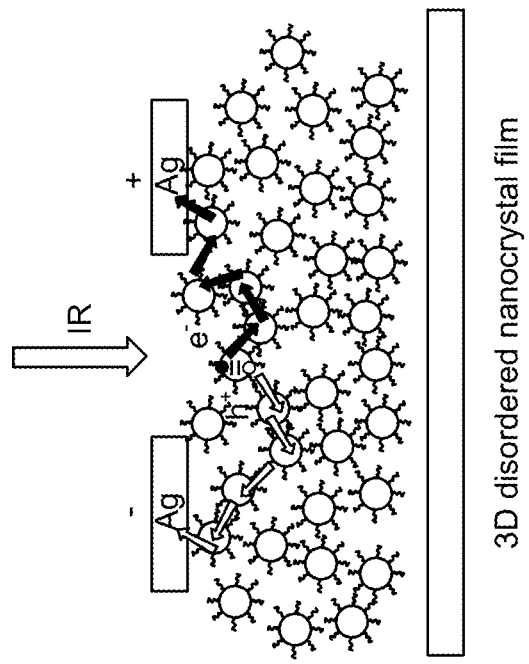
FIG. 10B is a schematic of a fabricated PbSe infrared photodetector, in accordance with one aspect of the present invention.
Figure 10A:
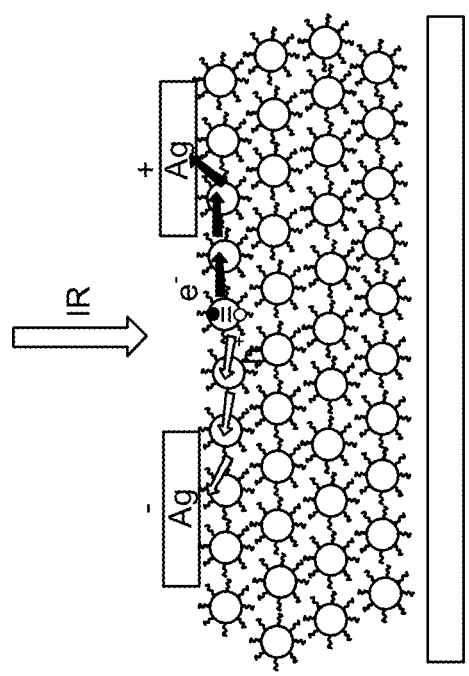
FIG. 10A is a schematic of a fabricated PbSe infrared photodetector (PD), in accordance with one aspect of the present invention.
Figure 10D:
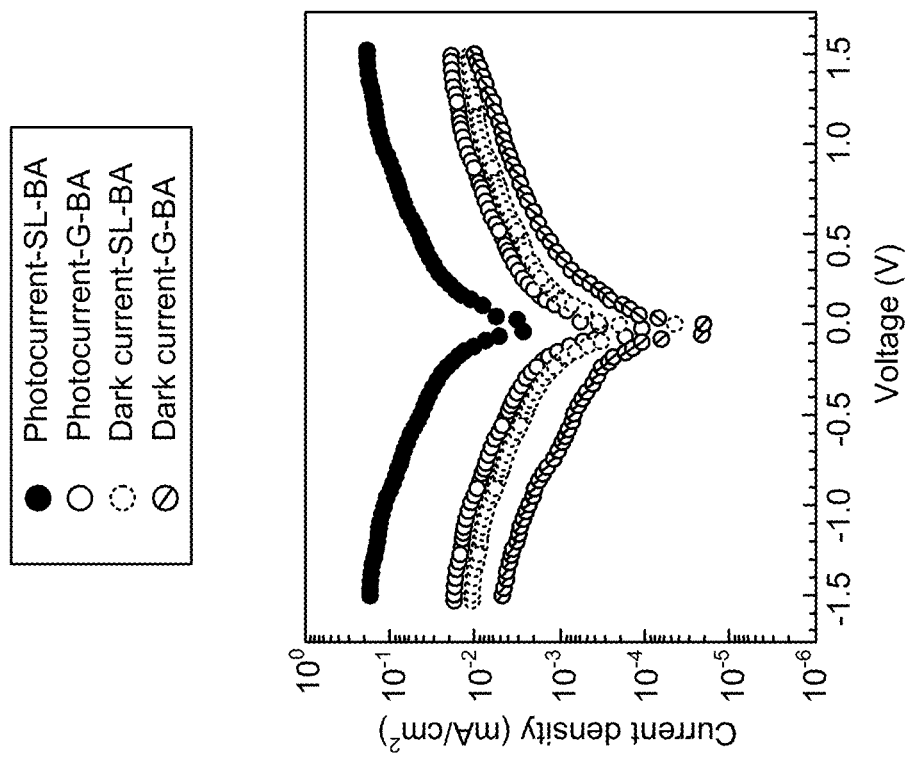
FIG. 10D includes the current-time characteristics of the PbSe NCSL PD and disordered NC PD with a 1 V bias under periodic illumination, in accordance with one aspect of the present invention.
Figure 10C:
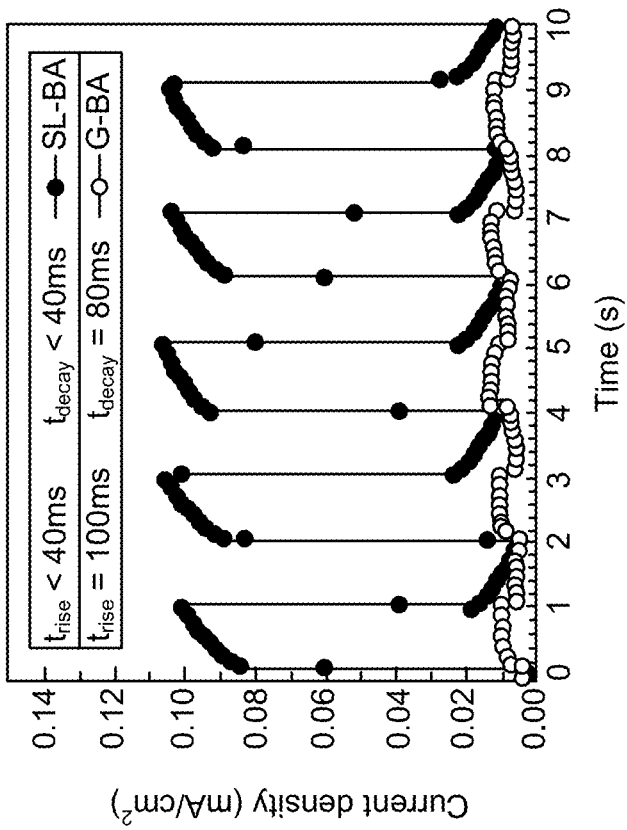
FIG. 10C includes semi-log plots of the current as a function of voltage (I-V) for the fabricated PbSe infrared photodetectors, in accordance with one aspect of the present invention.
Figure 11:
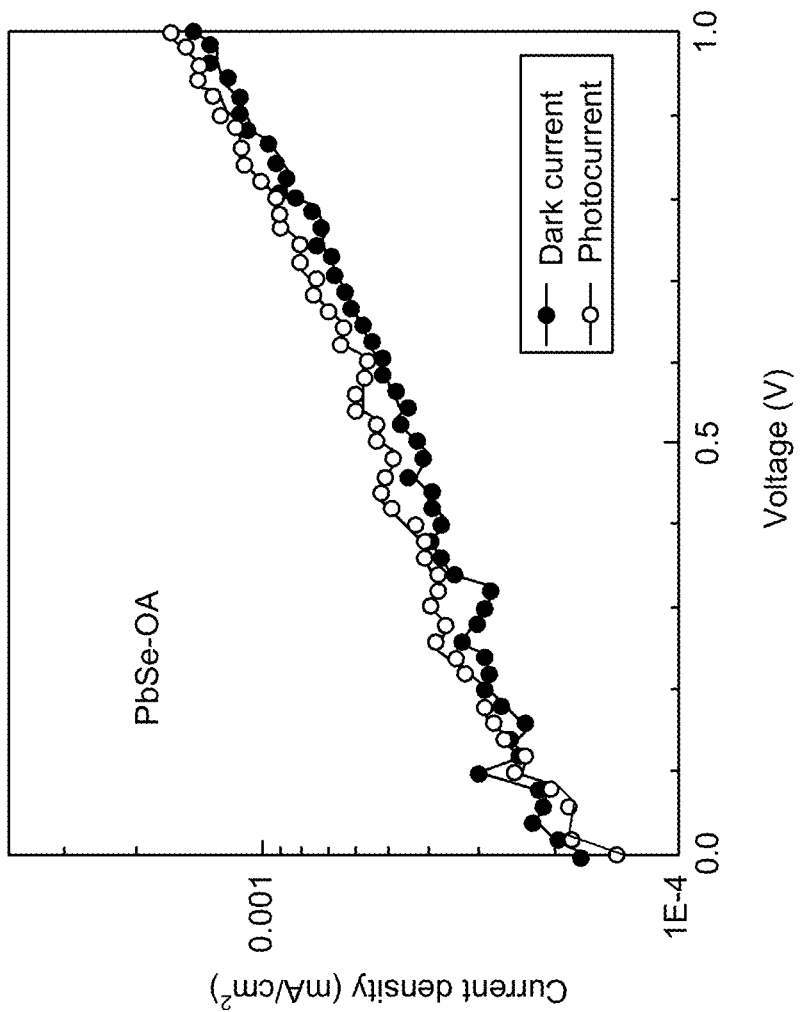
FIG. 11 is a plot of I-V characteristics of the 3D NCSL PbSe photodetector with native oleic acid ligands, in accordance with one aspect of the present invention.

With the successful replacement of the long insulating ligands with shorter ones and the preservation of the 3D superlattice structure, 3D PbSe NC infrared photodetectors were fabricated and compared to the optoelectronic properties of the 3D PbSe NC films with an ordered and disordered structure. As illustrated in FIGS. 10A and 10B, two types of PbSe infrared photodetectors with a comparable thickness were fabricated: one had a superlattice structure (designated as NCSL) and the other had a disordered/glass-like structure (designated as G). The planar photodetector devices were constructed with two Ag paste electrodes spaced 100 μm apart by a contact mask. As shown in semi-log plots of the current as a function of voltage (I-V) in FIG. 10C, after ligand exchange with benzoic acid, both the ordered and disordered PbSe NC films exhibited an increase in conductivity under infrared (IR) illumination (1200 nm, 400 μW $cm^{-2}$), while negligible photo-response was observed with the native oleic acid ligands (as shown in FIG. 11). FIG. 10D includes the current-time characteristics of the PbSe NCSL PD and disordered NC PD with a 1 V bias under periodic illumination. However, under the same conditions, the photocurrent of the ordered superlattice film was about an order of magnitude greater than that of the disordered film. For a high-performance photodetector, it is desirable to have a high photocurrent and a low dark current. Generally, IR photodetectors made from colloidal nanocrystals typically suffer from excess dark current due to the large densities of surface defect states of nanocrystals. The dark current density of the 3D PbSe NCSL-BA photodetector at 1 V was about $10^{-2}$ $mA/cm^2$, which suggests that the benzoic acid ligands not only reduced the interparticle spacing, but also decently passivated the surface dangling bonds. The dark current density of the ordered 3D PbSe NC film was about twice as high as that of the disordered film, which could be attributed to a higher carrier mobility resulting from the long-range order.

The sensitivity of a photodetector is commonly reported as responsivity, which is given by the ratio of the change in current on illumination to the incident optical power:

$$R = \frac{I_p - I_d}{PS} \quad (1)$$

Here, R is the responsivity (A/W), $I_p$ is the current under illumination, Id is the dark current, P is the optical power density (400 $\mu W/cm^2$), and S is the effective area under irradiation ($2\times10^{-3}$ $cm^2$). In this work, the PbSe PD with a disordered structure illuminated with 1200 nm wavelength light and a 1 V bias showed a responsivity of about 0.015 A/W, while the responsivity of the 3D NCSL PbSe PD under the same condition was about 0.25 A/W. This represents more than an order of magnitude improvement for the ordered structure compared to the disordered one and is comparable to the best-performing PbSe PDs found in the literature. The superior photocurrent and responsivity 3D NCSL PD are attributed to the higher packing density and better charge transport properties. Compared with a disordered NC film, the superlattice structure typically has a packing density that is about 10% to about 15% higher than that of an amorphous structure (e.g., glassy state). FIG. 11 is a plot of I-V characteristics of the 3D NCSL PbSe photodetector with native oleic acid ligands.

Figure 12:
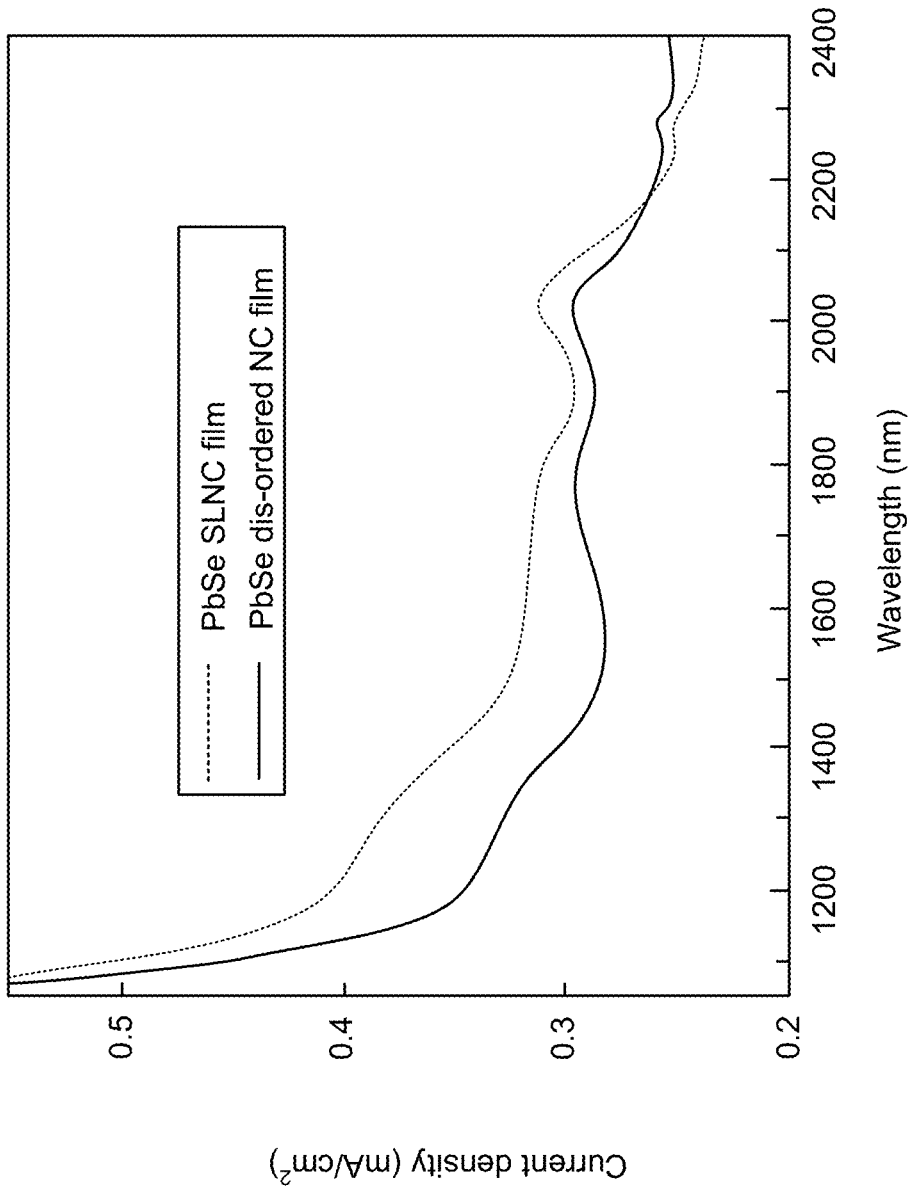
FIG. 12 includes absorption spectra of 3D PbSe nanocrystal films with and without a superlattice structure, in accordance with one aspect of the present invention.
Figure 13:
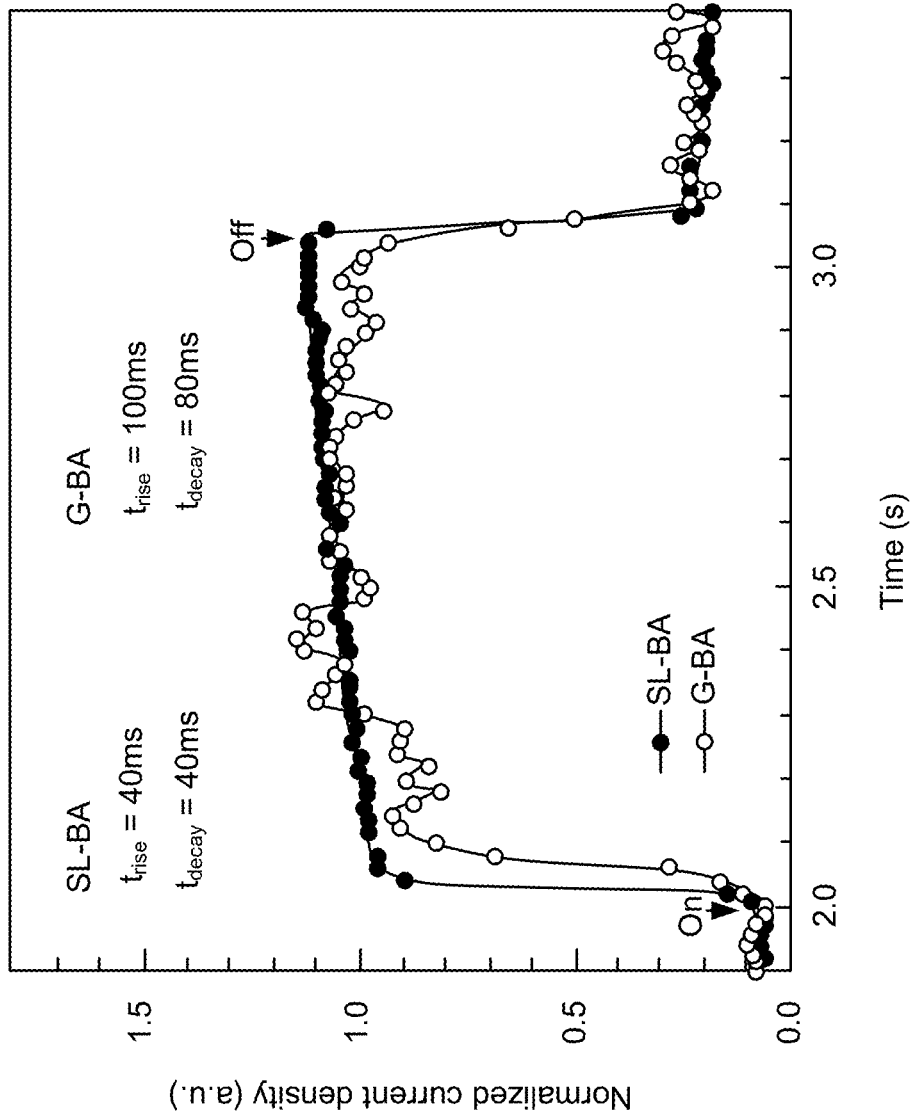
FIG. 13 includes normalized I-t curves of the 3D PbSe photodetector with a superlattice structure (SL-BA) and a glass-like disordered structure (G-BA), in accordance with one aspect of the present invention.
Figure 14:
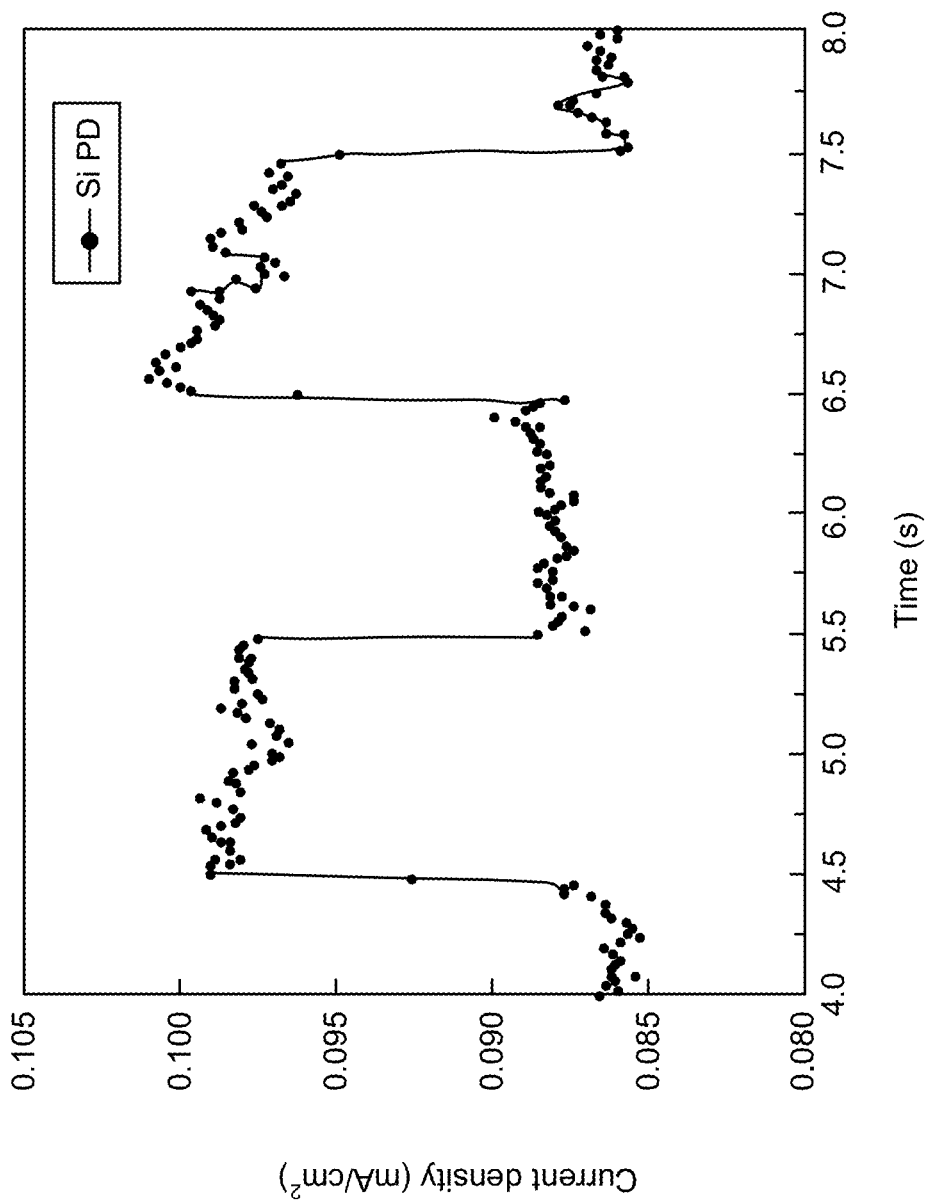
FIG. 14 includes an I-t curve for a Si photodetector, in accordance with one aspect of the present invention.

In addition to responsivity, response speed is another key parameter in the performance of a photodetector. The I-t characteristics (at 1 V) were tracked with periodical IR illuminations controlled by a chopper. As seen in FIG. 12, both the NCSL PbSe PD and disordered PbSe NC PD showed a rapid increase in current (<1 s) upon illumination, and rapid decay process when turning the light off. The photocurrent of the NCSL PbSe photodetector and G-PbSe photodetector was about 0.1 $mA/cm^2$ and about 0.01 $mA/cm^2$, respectively. And the on-off ratio under the same condition for the PbSe NC photodetectors with and without a superlattice structure was about 10 and 2.7, respectively, which is consistent with the observation from I-V characteristics. To gain more insight into the response time and quantitatively compare the response speed of the 3D PbSe PD with a superlattice structure and disordered structure, the I-t curves were normalized and displayed in FIG. 13. The rise time is defined as the time for the initial current to rise to 90% of the peak value and the decay time is defined as the time for the current to decay to 10% of the peak value. The resulting rise time and decay time of the NCSL PbSe-BA PD was about 40 ms/40 ms, which was faster than that of the disordered one (100 ms/80 ms). As the time resolution of the test set-up was about 40 ms (verified by a Si photodetector in FIG. 14), the inventors believe that the actual response speed of the NCSL PbSe-BA is potentially faster than 40 ms. The I-t curves of a Si photodetector using the same optoelectronic testing set-up that was used to measure the nanocrystal superlattice photodetector. A green light emitting diode was used as the light source. The time interval for current recording was 20 ms. The on-off illumination was controlled by a chopper. The rise and decay time of the Si photodetector with an equivalent size as that of the PbSe photodetector was 40 ms/40 ms, which suggests that the time resolution of the optoelectronic testing set-up was 40 ms. The faster response speed of the superlattice PDs was attributed to the lower defect densities of the high quality superlattice structure in contrast to a glass-like structure, which would facilitate carrier transport as defects typically serve as trapping centers for carriers.

Role of Ligand in Charge Transfer

Figure 15:
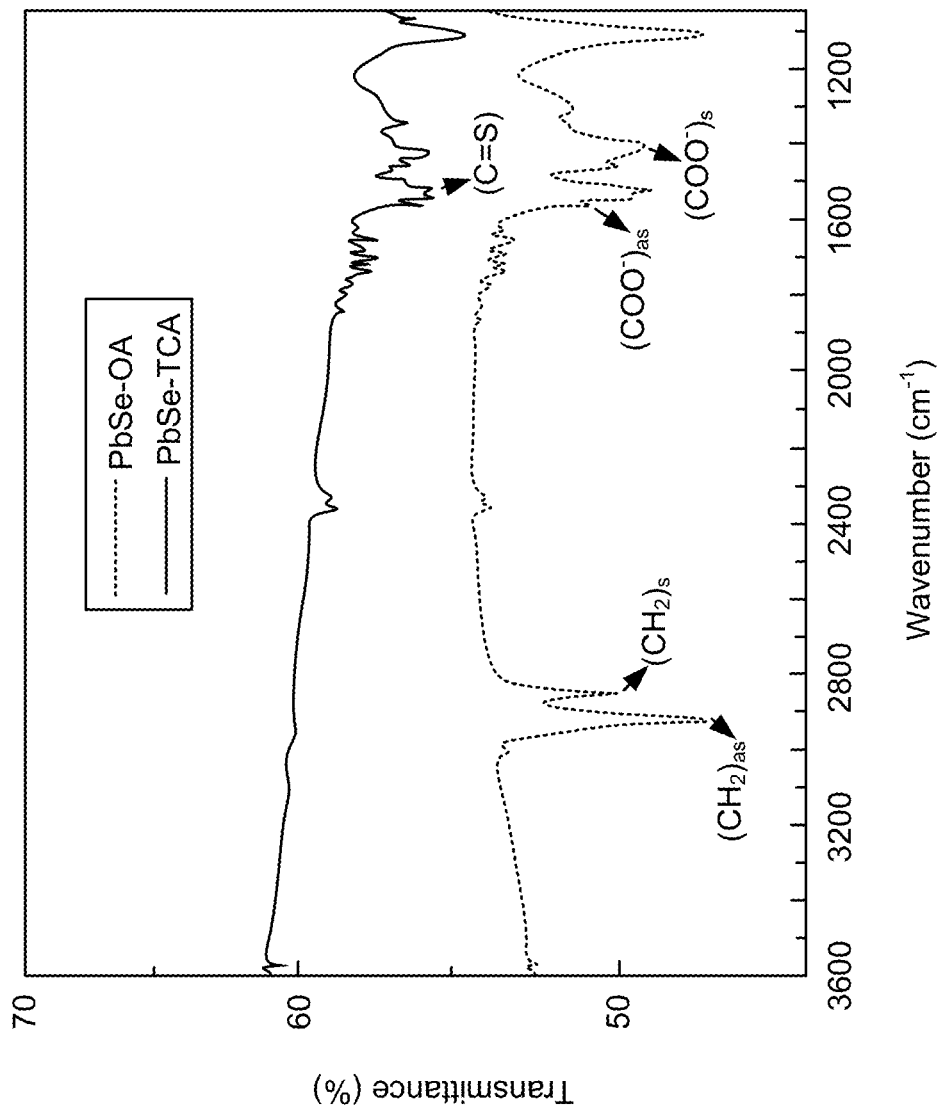
FIG. 15 includes Fourier-transform infrared spectroscopy (FTIR) spectra of the 3D NCSL film with the native ligand oleic acid (OA) and after one-step ligand exchange with 3-thiophenecarboxylic acid (TCA), in accordance with one aspect of the present invention.

To gain insight into the role of benzoic acid as the ligand for charge transport, 3-thiophenecarboxylic acid (3-TCA), with a similar aromatic ring and equivalent molecular length, was selected to investigate the ligand-ligand interactions between NCs for the collective optoelectronic properties. Thus, the 3D NCSL PbSe film assembled by EPD and treated with 3-TCA with a comparable thickness was fabricated via the rapid one-step solution ligand exchange method. According to associated GISAXS patterns, both the 3D PbSe NC films exchanged with benzoic acid (BA) and 3-thiophenecarboxylic acid (3-TCA) preserved a fcc superlattice structure, which suggests the validity of the one-step solution ligand exchange process described herein. From the integration of the GISAXS patterns, compared with the native ligand (OA), there was an equal shift of scatter peaks towards larger q values for BA and 3-TCA, which suggests the same amount decrease of interparticle spacing and is verified by the equivalent lattice constants from GISAXS indexing (in-plane/out-of-plane: 11 nm/10.6±0.4 nm). The corresponding FTIR spectra is shown in FIG. 15. The large reduction of peak intensities from the C—H stretch of $CH_3$ and emergence of C=S stretch of the thiophene ring indicates the effective ligand exchange from oleic acid to 3-thiophenecarboxylic acid.

Figure 16:
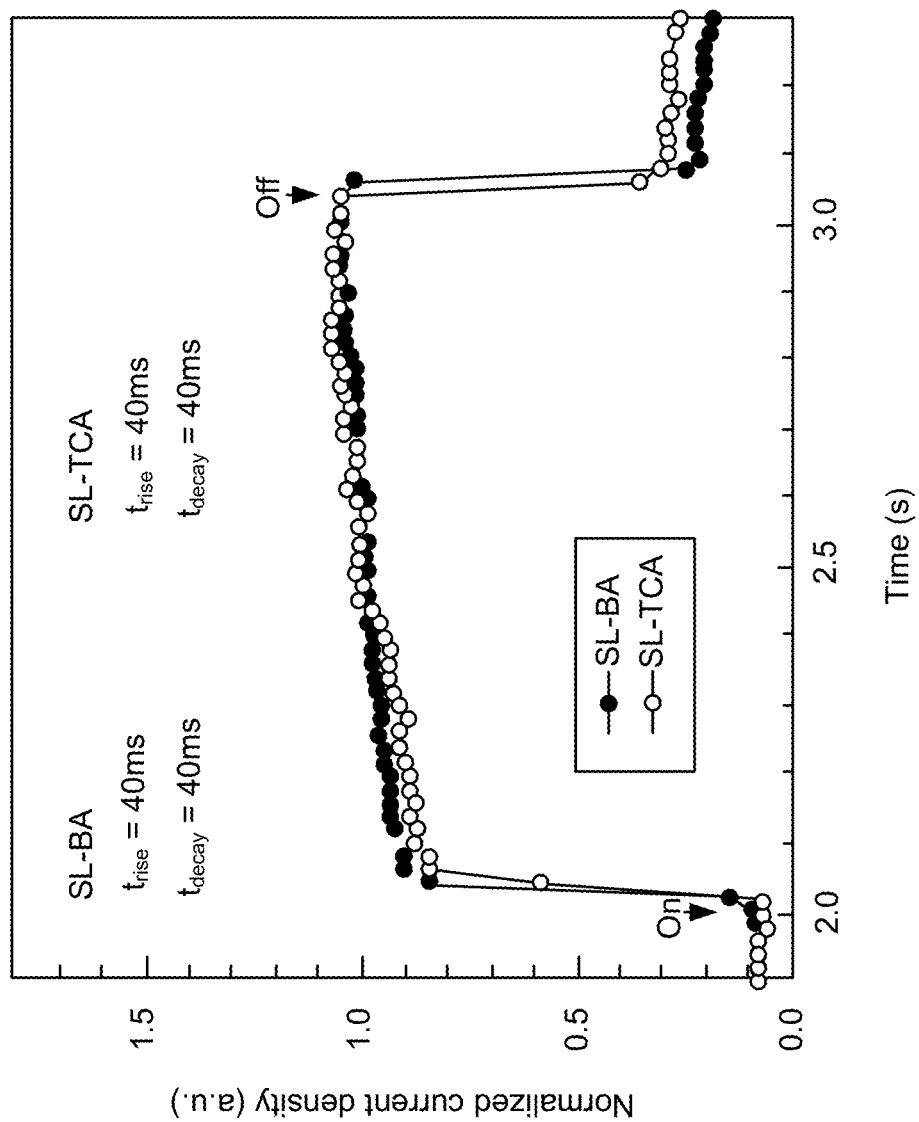
FIG. 16 includes normalized I-t curves of the 3D NCSL PbSe photodetector with the ligand of benzoic acid (BA) and 3-TCA, in accordance with one aspect of the present invention.

The photodetectors based on the 3D PbSe NCSL films with the ligand of BA and 3-TCA were thus fabricated and tested. The dark current densities of the 3D NCSL PbSe-TCA film resembled those of and 3D NCSL PbSe-BA film, indicating comparable carrier densities and mobilities. Under the IR illumination, both the 3D PbSe NCSL films with the ligand of BA and 3-TCA showed noticeable photoresponse, which suggests photogenerated electrons and holes were effectively transferred and collected via the electrodes. Under the same condition, the photocurrent of the 3D NCSL PbSe-BA film was about twice as high as that of the 3D NCSL PbSe-TCA film. The corresponding responsivities of these films were about 0.25 A/W and 0.1 A/W, respectively. The on-off I-t characteristics at 1 V showed rapid photoresponse for both films. To compare the response time of these photodetectors, the I-t curves are normalized and displayed in FIG. 16. The rise time and decay time of the 3D NCSL PbSe-TCA and 3D NCSL PbSe-BA were both shorter than 40 ms/40 ms.

Based on structural ordering and optoelectronic properties studies of the 3D NCSL PbSe films with different ligands (BA and 3-TCA), it is proposed that "pi-pi" interaction plays an important role in the charge transfer between nanocrystals. The interparticle distance of PbSe NCs after ligand exchange with BA and 3-TCA is nearly identical (~0.65±0.28 nm for out-of-plane) and the 3D superlattice structure was equivalently preserved. According to the simulation, the optimal pi-pi stacking distance is 3.45 Å for benzoic acid and 3.49 Å for 3-TCA, and the corresponding interparticle spacing with such ligands is 6 Å, which lies in the distance range for pi-pi interactions between two aromatic rings to happen. The strong pi-pi interactions between benzene rings favor for an efficient charge transfer between nanocrystals and the superlattice structure also ensure shorter charge transport pathways compared with a disordered structure, leading to a low photogenerated electron-hole recombination rate and high photocurrent. The major difference of BA and 3-TCA lies in the band structures, which may attribute to the difference of the photocurrent.

Various aspects of the present disclosure include a novel strategy to preserve the 3D superlattice structure of nanocrystal films after ligand exchange via a one-step rapid ligand exchange process. It was demonstrated that 3D PbSe NC photodetectors with a well-ordered superlattice structure exhibited a lower dark current of $10^{-2}$ mA/cm$^2$, an enhanced photocurrent (10 times higher), a faster response time (greater than 40 ms/40 ms) and a higher responsivity of about 0.25 A/W at 1 V, than that of a disordered PbSe film. In addition, the detector has a responsivity that is comparable to a state-of-the-art PbSe PD in the literature. Various aspects of the present disclosure not only offer a new way to tune the interparticle spacing while retaining the structural order, but also provide a new platform to explore and tailor the charge transport and optoelectronic properties of nanocrystal films through mesoscale packing structure.

Synthesis of Monodisperse PbSe Quantum Dots

Following Yu's method, in a typical reaction, lead (II) oxide (6 mmol) was dissolved in the mixture of 1-octadecene (73 mmol) and oleic acid (15 mmol) under degassing and uniform heating (up to 90° C.). The solution is heated to 130° C. under continuous $N_2$ flow and vigorous stirring until the solution became clear. The Pb precursor solution was dried by vacuuming. The solution is heated up to 180° C. and the TOP-Se solution (12 mmol of selenium dissolved in 23 mmol of tri-n-octylphosphine, with the addition of 0.45 mmol of diphenylphosphine) is immediately injected into the mixture to initiate the nucleation. The size of the PbSe quantum dots is determined by the reaction time. In this work, 5 min of reaction will result in an average nanocrystal size of about 7 nm. A water bath with liquid nitrogen is used to rapidly terminate the reaction. The resulting PbSe quantum dots were subsequently precipitated and cleaned with hexane and ethanol for 4 times and eventually dissolved in toluene and stored in the glovebox.

Assembly of 3D PbSe NC Superlattice Film Via EPD

For preparation of a typical EPD solution, 3 ml of PbSe NC dissolved in toluene (concentration of 4-5 mg/ml) was mixed with 0.6 ml of acetonitrile and sonicated for 15 seconds. Then, two parallel electrodes (silicon substrates) were vertically immersed in the solution mixture with a spacing of 5 mm. After applying a bias of 100 V for 10 min, a black PbSe NC film was formed on the negative electrode and could be taken out of the solution. With the evaporation of the solvent (about 1-2 min), a dry PbSe superlattice quantum dot film was obtained.

One-Step Ligand Exchange of a 3D Wet PbSe NC Superlattice Film

The one-step ligand exchange of a 3D superlattice film includes replacing the ligands while the superlattice lattice film is still "wet and loose." Once the 3D superlattice NC film was formed on the substrate and taken out of the NC solution, it was immediately immersed into the ligand solution with a small bias on (0.4 V/mm) for several minutes (about 2-5 min), and then the 3D NC film with the new ligands may be taken out of the solution and rinsed with acetonitrile and dried. Note that a compatible solvent environment preserves the "wet superlattice." If a sufficiently different solvent is used, the solvated superlattices lose their ordering during the ligand exchange process. Thus, the chosen ligands (benzoic acid, or 3-thiophenecarboxylic acid) were typically dissolved in the mixture of toluene and acetonitrile with a concentration of 20 mg/ml.

Preparation of the Control Film Via Dip-Coating

To prepare the control 3D PbSe NC film with a thickness comparable to the EPD-deposited films, numerous cycles (about 80) of layer-by-layer dip coating and ligand exchange process were performed. This entailed assembling one layer of PbSe nanocrystals with the native ligand on the Si substrate via dip coating, followed by immersion of the thin nanocrystal film in the ligand exchange solution for 1 min and rinsing with acetonitrile. This cycle was repeated until the desired thickness (about 500 nm) was built up.

X-Ray Scattering Measurements and Analysis

GISAXS was performed at the Advanced Light Source (ALS) beamline 7.3.3 using 10 keV radiation. Scattering photons were collected with a Pilatus 2 M detector. The sample-to-detector distance was 2478.8 mm, and the incident angle was 0.25°. The data were processed with Igor Pro based software packages written by and available for download from Jan Ilaysky. The integration of the GISAXS data was done by sector averaging, with the start angle of 50° and sector width of 40°.

Device Fabrication and Characterization

Two Ag pads with a spacing of 100 μm were pasted on the 3D PbSe film with a contact mask as the electrodes. All measurements were done in an ambient environment. A Keysight 1500A Semiconductor Device Parameter Analyzer was used to measure the current-voltage (I-V) and current-time (I-t) characteristics of the devices. To ensure the integrity of the current signals, the time intervals were set as 20 ms. An IR light source (SLS203L, Thorlabs) with a bandpass filter of 1200 nm and an irradiance of 400 μW cm$^{-2}$ was used to irradiate the device for the optoelectronic response studies. The on-off illumination was controlled by a beam shutter (SH1) and benchtop shutter controller (SC10) from Thorlabs. The incident power was recorded by a Digital Handheld Optical Power and Energy Meter Console (PM100D) coupled with a calibrated S148C photodiode.

Uses

In various aspects, the NC films produced using the one-step ligand exchange techniques described herein may be used for quantum dots, semi-conducting nanocrystal applications, nanocrystal based electronic devices, etc. Quantum dots may refer to nanocrystals which are small enough in size that the optoelectrical properties of the nanocrystal are a function of its size. For example, quantum dots produced according to at least some of the approaches described herein may be used as the base of light emitting diodes and/or electronic quantum dot-based resistors. The one-step rapid ligand exchange of quantum dot films may be used for a versatile range of electronic and optoelectronic devices such as transistors, photodetectors which cover a variety of different wavelengths (e.g., UV to longer wavelengths including visible light, x-rays, infrared (IR) detectors, etc.), biodetectors, sensors (e.g., gas sensors), solar cells, light emitting diodes, etc. The retained native structural ordering of the quantum dot film after ligand exchange enhances the performance of quantum dot devices. Further, the quantum dot films may be fabricated on flexible substrates such as wire form factors and/or textured substrates.

The one-step ligand exchange methodology described herein may be adapted for any application which uses nanocrystal films in a manner which would be determinable by one having ordinary skill in the art upon reading the present disclosure. For example, nanocrystals which are using in semiconductors, metals, other organic applications, etc., may be ordered into films for ligand exchange as described herein.

The inventive concepts disclosed herein have been presented by way of example to illustrate the myriad features thereof in a plurality of illustrative scenarios, embodiments, and/or implementations. It should be appreciated that the concepts generally disclosed are to be considered as modular, and may be implemented in any combination, permutation, or synthesis thereof. In addition, any modification, alteration, or equivalent of the presently disclosed features, functions, and concepts that would be appreciated by a person having ordinary skill in the art upon reading the instant descriptions should also be considered within the scope of this disclosure.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A method for one-step ligand exchange, the method comprising:
   at least partially submerging a substrate in a colloidal mixture of nanocrystals and a first solvent, wherein the nanocrystals have first ligands coupled thereto;
   applying an electric field to the colloidal mixture to form a solvated nanocrystal film having a thickness in a range of greater than 100 nm and less than about 2 microns;
   removing the solvated nanocrystal film from the first solvent; and
   applying a second solvent to the solvated nanocrystal film for ligand exchange,
   wherein the second solvent comprises second ligands,
   wherein the second solvent is applied to the solvated nanocrystal film for five minutes or less.

2. The method of claim 1, wherein the first ligands are relatively longer than the second ligands.

3. The method of claim 1, wherein the first solvent comprises a first component and a second component, wherein the first component and the second component of the first solvent are miscible, polar/non-polar pairs, wherein the second solvent comprises a first component and a second component, wherein the first component and the second component of the second solvent are miscible, polar/non-polar pairs.

4. The method of claim 1, wherein applying the second solvent to the solvated nanocrystal film for the ligand exchange includes forming a resulting nanocrystal film product, wherein the nanocrystal film product has at least one dimension greater than 100 nm.

5. The method of claim 4, wherein the solvated nanocrystal film is physically characterized as having a lattice constant in a range of about 10% to about 20% larger than the lattice constant of the nanocrystal film product.

6. The method of claim 4, wherein the nanocrystal film product comprises ordered nanocrystals characterized as having a domain size of greater than 100 nm.

7. The method of claim 4, comprising forming an optoelectronic device having the nanocrystal film product, the optoelectronic device being selected from the group consisting of: a sensor, a solar cell, a light emitting diode, and a photodetector.

8. The method of claim 1, wherein the nanocrystals comprise a material selected from the group consisting of: Ag, Au, Ni, $SiO_2$, and $TiO_2$.

9. The method of claim 1, wherein the substrate is a material selected from the group consisting of: silicon-based materials, metal-based materials, and indium tin oxide (ITO) coated substrates.

10. The method of claim 1, wherein a concentration of the nanocrystals in the first solvent is in a range of about 2 mg/mL to about 40 mg/mL.

11. The method of claim 1, wherein the first solvent and/or the second solvent include an additive selected from the group consisting of: methanol and dimethyl sulfoxide (DMSO).

12. The method of claim 1, wherein the thickness of the solvated nanocrystal film is a deposition thickness measured in a direction perpendicular to a surface of the solvated nanocrystal film.

13. The method of claim 1, wherein the thickness of the solvated nanocrystal film is greater than 500 nm.

14. The method of claim 1, wherein the ligand exchange occurs throughout the entire thickness of the solvated nanocrystal film.

15. The method of claim 1, wherein the second solvent is applied to the solvated nanocrystal film for three minutes or less.

16. The method of claim 15, wherein the ligand exchange occurs throughout the entire thickness of the solvated nanocrystal film in the three minutes or less.

17. The method of claim 1, wherein an order of the nanocrystals in the solvated nanocrystal film is retained during the ligand exchange.

18. The method of claim 1, comprising drying the solvated nanocrystal film after the ligand exchange for creating a dried nanocrystal film, wherein the solvated nanocrystal film is physically characterized as having a lattice constant in a range of about 10% to about 20% larger than a lattice constant of the dried nanocrystal film.

19. The method of claim 3, wherein the first component of the first solvent is different than the first component of the second solvent.

* * * * *